(12) United States Patent
Cheng

(10) Patent No.: US 12,550,560 B2
(45) Date of Patent: Feb. 10, 2026

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Tianyi Cheng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 422 days.

(21) Appl. No.: 18/258,249

(22) PCT Filed: May 27, 2022

(86) PCT No.: PCT/CN2022/095713
§ 371 (c)(1),
(2) Date: Jun. 19, 2023

(87) PCT Pub. No.: WO2023/226023
PCT Pub. Date: Nov. 30, 2023

(65) Prior Publication Data
US 2024/0381718 A1    Nov. 14, 2024

(51) Int. Cl.
*H10K 59/131* (2023.01)
*G09G 3/3266* (2016.01)
*H10K 59/65* (2023.01)

(52) U.S. Cl.
CPC ......... *H10K 59/131* (2023.02); *G09G 3/3266* (2013.01); *H10K 59/65* (2023.02); *G09G 2310/0286* (2013.01)

(58) Field of Classification Search
None
See application file for complete search history.

(56) References Cited

U.S. PATENT DOCUMENTS

2020/0176657 A1*  6/2020  Jang .................. H10H 20/857
2021/0020112 A1   1/2021  Ueno
(Continued)

FOREIGN PATENT DOCUMENTS

| CN | 109285466 A | 1/2019 |
| CN | 110289299 A | 9/2019 |

(Continued)

*Primary Examiner* — Kyoung Lee
(74) *Attorney, Agent, or Firm* — XSENSUS LLP

(57) ABSTRACT

A display panel has a functional device setting region and a primary display region. The functional device setting region is provided therein with a mounting hole, and the functional device setting region includes a border region surrounding the mounting hole. The display panel includes a substrate, pixel circuits, enable signal lines, scan signal lines and reset signal lines. At least one enable signal line includes a second enable signal sub-line located in the border region. At least one scan signal line includes a second scan signal sub-line located in the border region. At least one reset signal line includes a second reset signal sub-line located in the border region. Among second enable signal sub-lines of the enable signal lines, second scan signal sub-lines of the scan signal lines, and second reset signal sub-lines of the reset signal lines, at least three signal lines are located in different three layers.

20 Claims, 7 Drawing Sheets

(56) References Cited

U.S. PATENT DOCUMENTS

2021/0020734 A1  1/2021  Yokoyama et al.
2022/0334441 A1  10/2022  Hayashi

FOREIGN PATENT DOCUMENTS

| CN | 112582433 | A | 3/2021 |
| CN | 112602142 | A | 4/2021 |
| CN | 113380830 | A | 9/2021 |
| CN | 215069990 | U | 12/2021 |
| CN | 114188355 | A | 3/2022 |
| WO | 2019187151 | A1 | 10/2019 |
| WO | 2019198163 | A1 | 10/2019 |

* cited by examiner

DISPLAY PANEL AND DISPLAY DEVICE

CROSS-REFERENCE TO RELATED APPLICATION

This application is a national phase entry under 35 USC 371 of International Patent Application No. PCT/CN2022/095713, filed on May 27, 2022, which is incorporated herein by reference in its entirety.

TECHNICAL FIELD

The present disclosure relates to the field of display technologies, and in particular, to a display panel and a display device.

BACKGROUND

With the rapid development of display technologies, display devices have gradually come throughout people's lives. Organic light-emitting diodes (OLEDs) are widely used in mobile phones, televisions, laptop computers and other intelligent products due to their advantages of self-luminous, low power consumption, wide viewing angle, fast response, high contrast ratio, and flexible display.

SUMMARY

In an aspect, a display panel is provided. The display panel has a functional device setting region and a primary display region at least partially surrounding the functional device setting region, the functional device setting region is provided therein with a mounting hole, and the functional device setting region includes a border region.

The display panel includes a substrate, a plurality of pixel circuits, a plurality of enable signal lines, a plurality of scan signal lines and a plurality of reset signal lines. The plurality of pixel circuits are disposed on the substrate and located in the primary display region. The plurality of enable signal lines are electrically connected to the pixel circuits, and at least one enable signal line includes a first enable signal sub-line located in the primary display region and a second enable signal sub-line located in the border region. The plurality of scan signal lines are electrically connected to the pixel circuits, and at least one scan signal line includes a first scan signal sub-line located in the primary display region and a second scan signal sub-line located in the border region. The plurality of reset signal lines are electrically connected to the pixel circuits, and at least one reset signal line includes a first reset signal sub-line located in the primary display region and a second reset signal sub-line located in the border region.

Among second enable signal sub-lines of the plurality of enable signal lines, second scan signal sub-lines of the plurality of scan signal lines, and second reset signal sub-lines of the plurality of reset signal lines, at least three signal lines are located in different three layers.

In some embodiments, among the second enable signal sub-lines of the plurality of enable signal lines, the second scan signal sub-lines of the plurality of scan signal lines, and the second reset signal sub-lines of the plurality of reset signal lines, orthographic projections, on the substrate, of the at least three signal lines located in the different three layers at least partially overlap.

In some embodiments, the display panel includes a first gate conductive layer, a second gate conductive layer, and a third gate conductive layer that are arranged in sequence in a direction perpendicular to the substrate and away from the substrate; and among the second enable signal sub-lines of the plurality of enable signal lines, the second scan signal sub-lines of the plurality of scan signal lines, and the second reset signal sub-lines of the plurality of reset signal lines, the at least three signal lines are respectively located in the first gate conductive layer, the second gate conductive layer, and the third gate conductive layer.

In some embodiments, the second enable signal sub-lines of the plurality of enable signal lines are located in the second gate conductive layer. At least two reset signal lines each include a first reset signal sub-line located in the primary display region and a second reset signal sub-line located in the border region. A part of second reset signal sub-lines of the at least two reset signal lines is located in the first gate conductive layer, and another part of second reset signal sub-lines of the at least two reset signal lines is located in the third gate conductive layer. The second scan signal sub-lines of the plurality of scan signal lines are located in the second gate conductive layer.

In some embodiments, an orthographic projection, on the substrate, of a second reset signal sub-line located in the third gate conductive layer at least partially overlaps with orthographic projections, on the substrate, of the second enable signal sub-lines and/or the second scan signal sub-lines located in the second gate conductive layer. And/or, the orthographic projection, on the substrate, of the second reset signal sub-line located in the third gate conductive layer at least partially overlaps with an orthographic projection, on the substrate, of a second reset signal sub-line located in the first gate conductive layer.

In some embodiments, the at least two reset signal lines include a first reset signal line and a second reset signal line. The first reset signal line is configured to transmit a first reset signal, at least one first reset signal line includes a first reset signal sub-line and a second reset signal sub-line, and the second reset signal sub-line of the first reset signal line is located in the first gate conductive layer. The second reset signal line is configured to transmit a second reset signal, at least one second reset signal line includes a first reset signal sub-line and a second reset signal sub-line, and the second reset signal sub-line of the second reset signal line is located on the third gate conductive layer.

In some embodiments, the plurality of scan signal lines include a plurality of first scan signal lines, and the plurality of first scan signal lines are configured to transmit first scan signals. At least one first scan signal line includes a first scan signal sub-line and a second scan signal sub-line, and the second scan signal sub-line of the first scan signal line is located in the second gate conductive layer.

In some embodiments, the display panel has a peripheral region, the peripheral region is located at least on a first side and a second side of the primary display region, and the first side and the second side are two opposite sides of the primary display region.

The plurality of scan signal lines further include a plurality of second scan signal lines configured to transmit second scan signals; the plurality of second scan signal lines include first-type scan signal lines, second-type scan signal lines and third-type scan signal lines; and the mounting hole is located on an extending direction of the second-type scan signal lines and the third-type scan signal lines.

The first-type scan signal lines extend from a portion of the peripheral region located on the first side of the primary display region to another portion of the peripheral region located on the second side of the primary display region along a first direction. The second-type scan signal lines extend from the portion of the peripheral region located on the first side of the primary display region to the border region along the first direction. The third-type scan signal lines extend from the another portion of the peripheral region located on the second side of the primary display region to the border region along the first direction.

In some embodiments, the display panel further includes a first scan driving circuit and a second scan driving circuit. The first scan driving circuit is disposed in the peripheral region and located on the first side of the primary display region. The first scan driving circuit is electrically connected to the first scan signal lines, the first-type scan signal lines, the second-type scan signal lines, the enable signal lines, and the reset signal lines. The second scan driving circuit is disposed in the peripheral region and located on the second side of the primary display region. The second scan driving circuit is electrically connected to the first-type scan signal lines and the third-type scan signal lines.

In some embodiments, the first scan driving circuit includes a plurality of first shift registers that are connected in cascade; each first shift register is electrically connected to at least two of the first scan signal lines, at least two of the enable signal lines, at least two first reset signal lines and at least two second reset signal lines; and each first shift register is further electrically connected to at least two of the first-type scan signal lines or at least two of the second-type scan signal lines. The second scan driving circuit includes a plurality of second shift registers that are connected in cascade, and each second shift register is electrically connected to at least two of the first-type scan signal lines or at least two of the third-type scan signal lines.

In some embodiments, among at least two first scan signal lines connected to a same first shift register, one first scan signal line includes a first scan signal sub-line and a second scan signal sub-line, each remaining first scan signal line includes two scan line segments, one scan line segment is connected to the same first shift register and an end of the second scan signal sub-line of the one scan line segment, and another scan line segment is electrically connected to another end of the second scan signal sub-line of the one scan line segment and extends to a border of the second side of the primary display region.

And/or, among at least two enable signal lines connected to the same first shift register, one enable signal line includes a first enable signal sub-line and a second enable signal sub-line, each remaining enable signal line includes two enable line segments, one enable line segment is connected to the same first shift register and an end of the second enable signal sub-line of the one enable signal line, and another enable line segment is electrically connected to another end of the second enable signal sub-line of the one enable signal line and extends to the border of the second side of the primary display region.

And/or, among at least two first reset signal lines connected to the same first shift register, one first reset signal line includes a first reset signal sub-line and a second reset signal sub-line, each remaining first reset signal line includes two first reset line segments, one first reset line segment is connected to the same first shift register and an end of the second reset signal sub-line of the one first reset signal line, and another first reset line segment is electrically connected to another end of the second reset signal sub-line of the one first reset signal line and extends to the border of the second side of the primary display region.

And/or, among at least two second reset signal lines connected to the same first shift register, one second reset signal line includes a first reset signal sub-line and a second reset signal sub-line, each remaining second reset signal line includes two second reset line segments, one second reset line segment is connected to the same first shift register and an end of the second reset signal sub-line of the one second reset signal line, and another second reset line segment is electrically connected to another end of the second reset signal sub-line of the one second reset signal line and extends to the border of the second side of the primary display region.

In some embodiments, the display panel further includes a first source-drain conductive layer and a second source-drain conductive layer, the first source-drain conductive layer is disposed on a side of the third gate conductive layer away from the substrate, and the second source-drain conductive layer is disposed on a side of the first source-drain conductive layer away from the substrate.

The display panel further includes a plurality of data lines electrically connected to the pixel circuits; at least two data lines each include a first data sub-line located in the primary display region and a first data sub-line located in the border region; and among at least two second data sub-lines located in the border region, a part of second data sub-lines is located in the first source-drain conductive layer, and another part of second data sub-lines is located in the second source-drain conductive layer.

In some embodiments, an orthographic projection, on the substrate, of a second data sub-line located in the first source-drain conductive layer and an orthographic projection, on the substrate, of a signal line located in the third gate conductive layer are staggered; and/or, a border of the orthographic projection, on the substrate, of the second data sub-line located in the first source-drain conductive layer is located within a border of the orthographic projection, on the substrate, of the signal line located in the third gate conductive layer.

In some embodiments, two opposite side faces of a signal line located in the third gate conductive layer are first inclined surfaces; and a distance between borders, away from the substrate, of two first inclined surfaces of a same signal line is less than a distance between borders, proximate to the substrate, of the two first inclined surfaces.

In some embodiments, an included angle between a first inclined surface and a plane where a surface of the substrate away from the first gate conductive layer is located is less than or equal to 30°.

In some embodiments, an orthogonal projection, on the substrate, of a signal line located in the first gate conductive layer and an orthogonal projection, on the substrate, of a signal line located in the second gate conductive layer are staggered; and/or, a border of the orthographic projection, on the substrate, of the signal line located in the second gate conductive layer is located within a border of the orthographic projection, on the substrate, of the signal line located in the first gate conductive layer.

In some embodiments, two opposite side faces of a signal line located in the first gate conductive layer are second inclined surfaces; and a distance between borders, away from the substrate, of two second inclined surfaces of a same signal line is less than a distance between borders, proximate to the substrate, of the two second inclined surfaces.

In some embodiments, an included angle between a second inclined surface and a plane where a surface of the substrate away from the first gate conductive layer is located is less than or equal to 30°.

In some embodiments, the display panel further includes an interlayer insulating layer, a second gate insulating layer and a third gate insulating layer. The interlayer insulating layer is disposed between the first source-drain conductive layer and the third gate conductive layer, the second gate insulating layer is disposed between the first gate conductive layer and the second gate conductive layer, and the third gate insulating layer is disposed between the second gate conductive layer and the third gate conductive layer. A thickness of the third gate insulating layer is greater than a thickness of the interlayer insulating layer, and is greater than a thickness of the second gate insulating layer.

In some embodiments, the thickness of the interlayer insulating layer is in a range from 4750 Å to 5250 Å; and/or, the thickness of the second gate insulating layer is in a range from 1235 Å to 1365 Å; and/or, the thickness of the third gate insulating is in a range from 5225 Å to 5775 Å.

In another aspect, a display device is provided. The display device includes the display panel as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
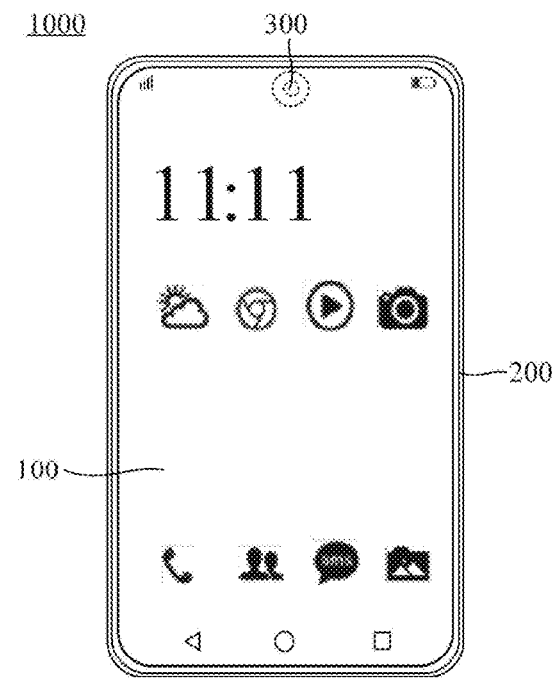
FIG. 1 is a structural diagram of a display device, in accordance with some embodiments.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, the term "comprise" and other forms thereof such as the third-person singular form "comprises" and the present participle form "comprising" throughout the specification and the claims are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms do not necessarily refer to the same embodiment(s) or example(s). In addition, the specific features, structures, materials or characteristics may be included in any one or more embodiments or examples in any suitable manner.

The terms "first" and "second" are used for descriptive purposes only, and are not to be construed as indicating or implying a relative importance or implicitly indicating a number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the terms "connected" and derivatives thereof may be used. For example, the term "connected" may be used in the description of some embodiments to indicate that two or more components are in direct physical or electrical contact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values beyond those stated.

The term such as "about", "substantially" or "approximately" as used herein includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature being curved. Therefore, the regions shown in the accompanying drawings are schematic in nature, and their shapes are not intended to show actual shapes of regions in a device, and are not intended to limit the scope of the exemplary embodiments.

In some embodiments, a control electrode of each transistor is a gate of the transistor, a first electrode of the transistor is one of a source and a drain of the transistor, and a second electrode of the transistor is another one of the source and the drain of the transistor. Since the source and the drain of the transistor may be symmetrical in structure, the source and the drain of the transistor may be indistinguishable in structure. That is to say, the first electrode and the second electrode of the transistor in the embodiments of the present disclosure may be same in structure. For example, in a case where the transistor is a P-type transistor, the first electrode of the transistor is the source, and the second electrode is the drain. For example, in a case where the transistor is an N-type transistor, the first electrode of the transistor is the drain, and the second electrode is the source.

The "same layer" mentioned herein refers to a layer structure that is formed by forming a film layer for forming specific patterns by using a same film forming process, and then performing a single patterning process by using a same mask. Depending on different specific patterns, the single patterning process may include multiple exposure, development or etching processes, and the specific patterns in the formed layer structure may be continuous or discontinuous, and these specific patterns may also be at different heights or have different thicknesses.

As shown in FIG. 1, some embodiments of the present disclosure provide a display device 1000, and the display device 1000 may be any device that displays images whether in motion (e.g., videos) or stationary (e.g., still images), and whether literal or graphical. For example, the display device 1000 may be a television, a laptop computer, a tablet computer, a mobile phone, a personal digital assistant (PDA), a navigator, a wearable device, and a virtual reality (VR) equipment and any other product or component with a display function.

In some embodiments, as shown in FIG. 1, the display device 1000 includes a display panel 100.

For example, the display device 1000 may further include a housing 200, a functional device 300, a circuit board and other electronic accessories. The display panel 100, the functional device 300 and the circuit board may be disposed in the housing 200.

In addition, the circuit board may be bonded to the display panel 100 at an end of the display panel 100 and bent to a back side of the display panel 100, so as to reduce an outer frame of the display panel 100 and increase a screen-to-body ratio of the display panel 100. The functional device 300 may be integrated directly below a non-display side of the display panel 100, so as to reduce the outer frame of the display panel 100 and increase the screen-to-body ratio of the display panel 100.

It should be noted that the functional device 300 may be a camera, an infrared sensor, a proximity sensor, an eye tracking module, a face recognition module, and the like. For example, as shown in FIG. 1, the functional layer 300 is a camera.

Figure 2:
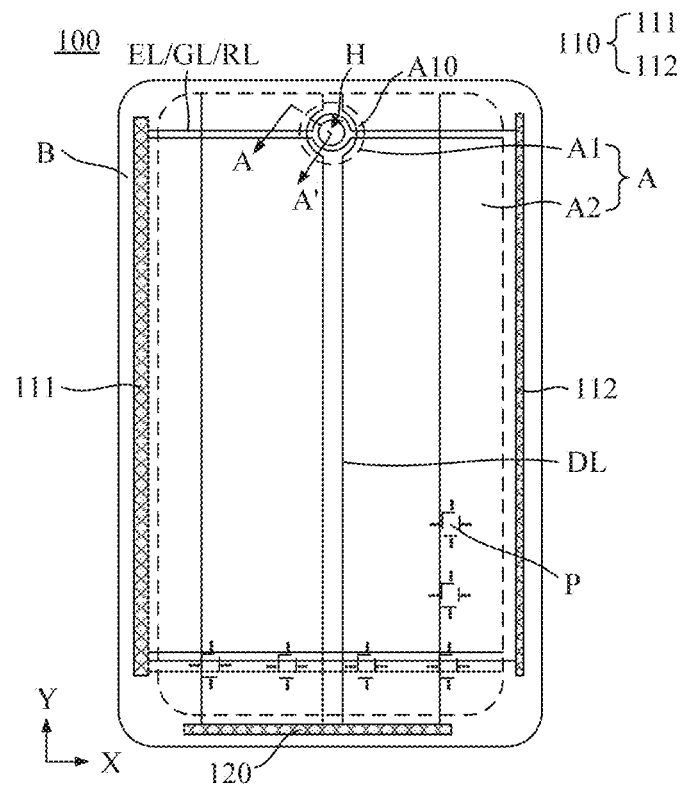
FIG. 2 is a structural diagram of a display panel, in accordance with some embodiments.
Figure 3:
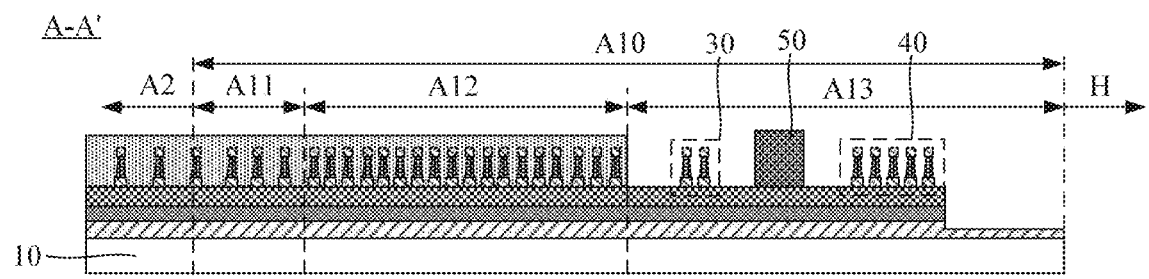
FIG. 3 is a sectional view taken along the line A-A' in FIG. 2.

Referring to FIGS. 1, 2 and 3, the display panel 100 may be provided therein with a mounting hole H, and the functional device 300 may be mounted in the mounting hole H, so as to prevent the display panel 100 from blocking the lighting for the functional device 300.

The type of the substrate 100 varies, which may be set according to actual needs. For example, the display panel 100 may be an organic light-emitting diode (OLED) display panel, a quantum dot light-emitting diode (QLED) display panel, or a micro light-emitting diode (micro LED) display panel, which is not specifically limited in the embodiments of the present disclosure.

Some embodiments of the present disclosure are schematically described below by considering an example in which the display panel 100 is the OLED display panel.

In some embodiments, as shown in FIG. 2, the display panel 100 has a display region A and a peripheral region B disposed on at least one side of the display region A. FIG. 2 illustrates an example in which the peripheral region B is disposed around the display region A.

The display region A is a region where images are displayed, and is configured to provide a plurality of sub-pixels P. The peripheral region B is a region where images are not displayed, and the peripheral region B is configured to provide display driving circuits, such as a scan driving circuit 110 and a source driving circuit 120.

It should be noted that the scan driving circuit 110 may include a light-emitting control circuit and a gate driving circuit. Some embodiments of the present disclosure will be schematically described below by taking an example in which the scan driving circuit 110 includes the light-emitting control circuit and the gate driving circuit.

In addition, as shown in FIGS. 1, 2 and 3, in a case where the functional device 300 is integrated below the display panel 100, the display region A includes a functional device setting region A1 and a primary display region A2 at least partially surrounding the functional device setting region A1. The mounting hole H is disposed in the functional device setting region A1, and the functional device setting region A1 includes a border region A10 surrounding the mounting hole H. FIGS. 1 and 2 each illustrate an example in which the primary display region A2 surrounds the functional device mounting region A1.

In some embodiments, as shown in FIG. 3, the border region A10 includes a redundant region A11, a wiring region A12 and an encapsulation region A13 that are arranged in sequence in a direction from the primary display region A2 pointing to the mounting hole H. The redundant region A11 is configured to provide a process gap for the wiring region A12 and the primary display region A2, the wiring region A12 is configured to provide circuit wirings, and the encapsulation region A13 is configured to provide an encapsulation layer for blocking invasion of water and oxygen.

For example, the encapsulation region A13 is provided therein with an inner isolation column 30, a barrier portion 40 and an outer isolation column 50.

Some embodiments of the present disclosure are schematically described below by taking an example in which the display region A includes the functional device setting region A1 and the primary display region A2 at least partially surrounding the functional device setting region A1.

In some embodiments, as shown in FIGS. 2 and 3, the display panel 100 may include a substrate 10 and the scan driving circuit 110. The substrate 10 is used for carrying the scan driving circuit 110.

The type of the substrate 10 varies, which may be set according to actual needs.

For example, the substrate 10 may be a rigid substrate. For example, the rigid substrate may be a glass substrate or a polymethyl methacrylate (PMMA) substrate.

For example, the substrate 10 may be a flexible substrate. For example, the flexible substrate may be a polyethylene terephthalate (PET) substrate, a polyethylene naphthalate (PEN) substrate, or a polyimide (PI) substrate.

In some embodiments, as shown in FIGS. 2 and 3, the display panel 100 may further include the plurality of sub-pixels P. The plurality of sub-pixels P and the scan driving circuit 110 are disposed on a same side of the substrate 10, and are located in the display region A.

The plurality of sub-pixels P may be arranged in a plurality of rows and a plurality of columns; each row includes multiple sub-pixels P arranged in a first direction X, and each column includes multiple sub-pixels P arranged in a second direction Y; and the first direction X is approximately perpendicular to the second direction Y.

Figure 4:
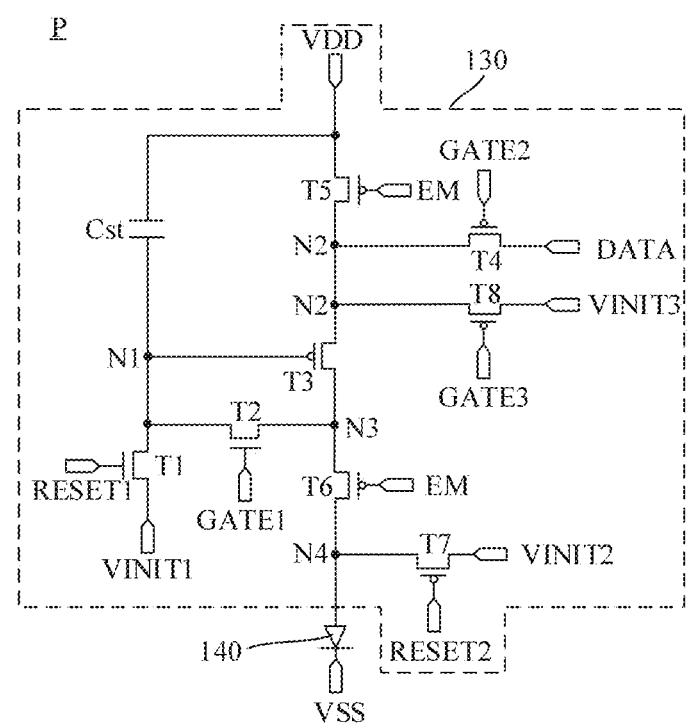
FIG. 4 is a circuit diagram of a sub-pixel, in accordance with some embodiments.

It should be noted that, referring to FIG. 4, each sub-pixel P may include a pixel circuit 130 and a light-emitting device 140 electrically connected to the pixel circuit 130, and the light-emitting device 140 may be an OLED.

In some embodiments, as shown in FIG. 2, the display panel 100 may further include a plurality of enable signal lines EL, a plurality of scan signal lines GL, a plurality of reset signal lines RL, and a plurality of data lines DL. FIG. 2 illustrates only a part of the enable signal lines EL, a part of the scan signal lines GL, a part of the reset signal lines RL and a part of the plurality of data lines DL.

The plurality of enable signal lines EL, the plurality of scan signal lines GL and the plurality of reset signal lines RL approximately extend in the first direction X, and the plurality of data lines DL approximately extend in the second direction Y.

Herein, the description of "extending approximately in the first direction X" means that an overall routing direction of signal lines (the enable signal lines EL, the plurality of scan signal lines GL, and the plurality of reset signal lines RL) is the first direction X, but it is not limited that each position of the signal lines strictly extends in the first direction X. That is to say, the description of "extending approximately in the first direction X" here indicates signal lines that each position thereof extends strictly in the first direction X, and further indicates signal lines that local segments thereof are bent for avoidance in consideration of interference from other structures. For example, some signal lines are bent around the mounting hole H and bypass the mounting hole H in the border region A10, and details will be described below herein in conjunction with the structure of the pixel circuit and the specific film layer structure.

Herein, the description of "extending approximately in the second direction Y" means that an overall routing direction of the data lines DL is the second direction Y, but it is not limited to each position of the data lines DL strictly extends in the second direction Y. That is to say, the description of "extending approximately in the second direction Y" here indicates data lines DL that each position thereof extends strictly in the second direction Y, and indicates data lines DL that local segments thereof are bent for avoidance in consideration of interference from other structures. For example, some data lines DL are bent around the mounting hole H and bypass the mounting hole H in the border region A10, and details will be described below herein in conjunction with the structure of the pixel circuit and the specific film layer structure.

On this basis, pixel circuits 130 in the same row of sub-pixels P may be electrically connected to a group of signal lines (enable signal line(s) EL, scan signal lines GL, and reset signal lines RL) extending approximately in the first direction X, and pixel circuits 130 in the same column of sub-pixels P may be electrically connected to one data line DL.

It should be noted that the group of signal lines extending approximately in the first direction X includes at least one enable signal line EL, at least one scan signal line GL and at least one reset signal line RL. The number of signal lines included in the group of signal lines extending approximately in the first direction X depends on the structure of the pixel circuit 130, which will be described below herein in conjunction with the structure of the pixel circuit 130.

In some embodiments, referring to FIG. 4, the pixel circuit 130 adopts a low temperature polycrystalline oxide (LTPO) technology. That is, a pixel circuit 130 includes low temperature polycrystalline silicon (LTPS) thin film transistor(s) and oxide thin film transistor(s). In this way, it may be possible to achieve high charge mobility, high stability and high scalability at low production costs.

In this case, the pixel circuit 130 has two types of active layers, an active layer pattern of the LTPS thin film transistor is made of low temperature polysilicon, and an active layer pattern of the oxide thin film transistor is made of oxide.

Some embodiments of the present disclosure will be schematically described below by taking an example in which the pixel circuit 130 is an LTPO pixel circuit.

It should be understood that, the structure of the pixel circuit 130 varies, which may be set according to actual needs. For example, the structure of the pixel circuit 130 may be a structure of "2T1C", "3T1C", "6T1C", "7T1C", "8T1C", "6T2C", or "7T2C". Here, "T" represents a transistor, a number in front of "T" represents the number of thin film transistors, "C" represents a storage capacitor, and a number in front of "C" represents the number of storage capacitors.

In addition, during the use of the display panel 100, stabilities of the transistors and the light-emitting device 140 in the pixel circuit 130 may decrease (for example, a threshold voltage of a driving transistor drifts), which affects the display effect of the display panel 100. Thus, the sub-pixel P is required for compensation.

The compensation manner of the sub-pixel P may varies, which may be set according to actual needs. For example, a compensation circuit may be provided in the sub-pixel P, so that the compensation circuit may be used to perform internal compensation for the sub-pixel P. As another example, the driving transistor or the light-emitting device may be sensed through a transistor in the sub-pixel P, and sensed data may be transmitted to an external sensing circuit, so that the external sensing circuit is used to calculate a driving voltage value that needs to be compensated and give feedback, thereby realizing an external compensation for the sub-pixel P.

The structure and an operating process of the sub-pixel P will be schematically described by taking an example in which an internal compensation manner is adopted and the pixel circuit 130 adopts an "8T1C" structure in the present disclosure. Moreover, in the following description, the pixel circuit 130 is any one of pixel circuits 130 located in an Nth row of sub-pixel P, N being a positive integer.

For example, as shown in FIG. 4, the pixel circuit 130 includes eight transistors T and one storage capacitor Cst.

A first transistor T1 is a reset transistor for resetting a first node, a second transistor T2 is a diode-conductive transistor, a third transistor T3 is a driving transistor, a fourth transistor T4 is a data writing transistor, a fifth transistor T5 and a sixth transistor T6 are light-emitting control transistors, a seventh transistor T7 is a reset transistor for resetting an anode of the light-emitting device (a fourth node N4), and an eighth transistor is a reset transistor for resetting a second node and a third node.

It should be noted that the third transistor T3 may be of a double-gate structure to improve the stability of the third transistor T3.

In some embodiments, as shown in FIG. 4, the transistors T3, T4, T5, T6, T7 and T8 are P-type LTPS transistors, so that these transistors have higher mobility and more stable source voltage, and are suitable for driving the light-emitting device 140; and the transistors T1 and T2 are N-type oxide transistors, so that the first transistor T1 and the second transistor T2 have lower leakage current, which may better keep voltages of the third transistor T3 and the storage capacitor Cst stable.

It will be noted that, in the circuit shown in FIG. 4, the nodes N1, N2, N3 and N4 do not represent actual components, but represent junction points of relevant electrical connections in the circuit diagram. That is, there nodes are nodes equivalent to the junctions of the relevant electrical connections in the circuit diagram.

Figure 5:
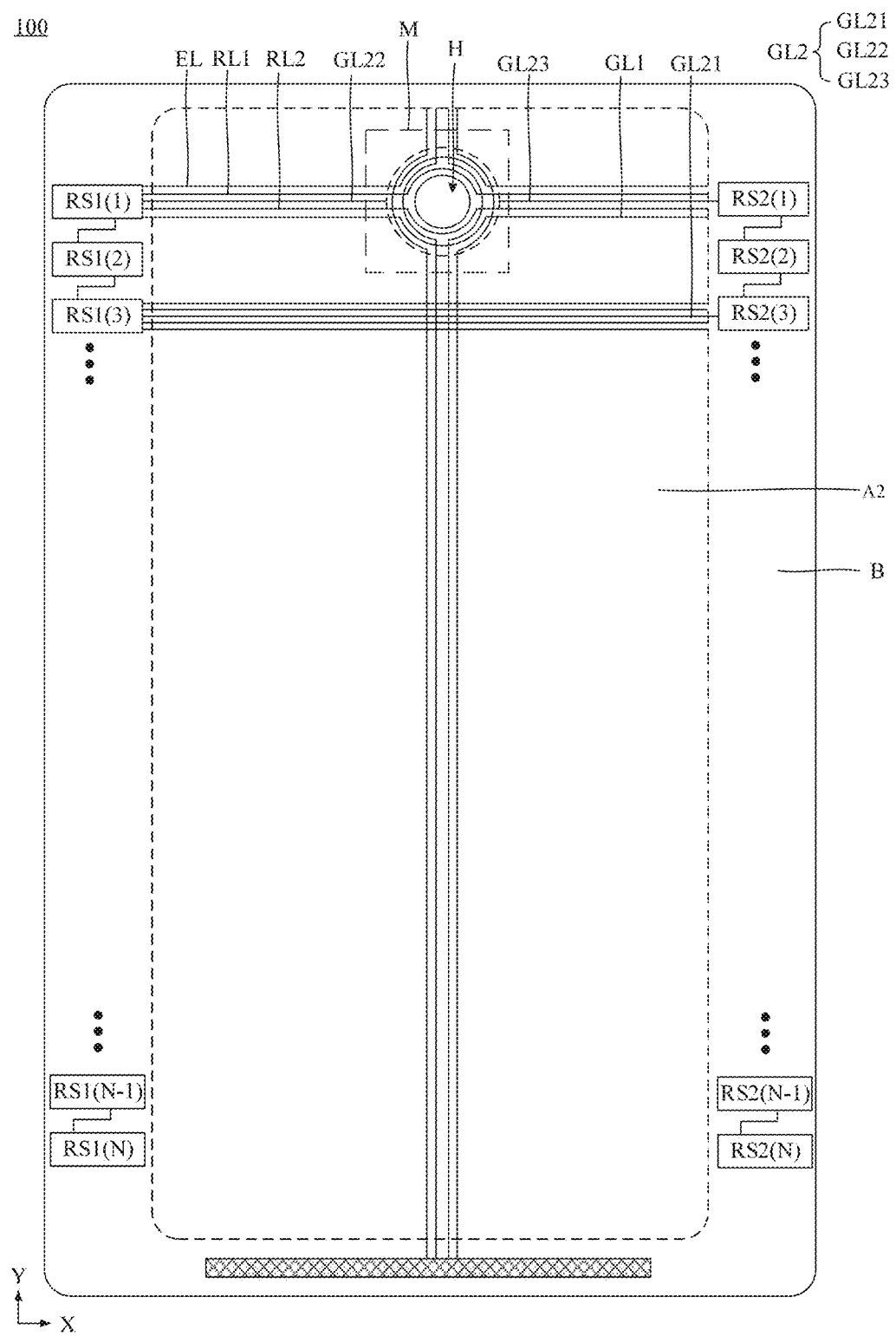
FIG. 5 is a structural diagram of another display panel, in accordance with some embodiments.

Based on the structure of the pixel circuit 130, referring to FIG. 5, a group of signal lines may include one enable signal line EL, two scan signal lines GL and two reset signal lines RL.

As shown in FIGS. 4 and 5, the enable signal line EL is electrically connected to an enable signal terminal EM of the pixel circuit 130, and is configured to transmit an enable signal Em.

As shown in FIGS. 4 and 5, the two scan signal lines GL may include a first scan signal line GL1 and a second scan signal line GL2. The first scan signal line GL1 is electrically connected to a first scan signal terminal GATE1 of the pixel circuit 130, and is configured to transmit a first scan signal Gate1. The second scan signal line GL2 is electrically connected to a second scan signal terminal GATE2 of the pixel circuit 130, and is configured to transmit a second scan signal Gate2.

As shown in FIGS. 4 and 5, the two reset signal lines RL may include a first reset signal line RL1 and a second reset signal line RL2. The first reset signal line RL1 is electrically connected to a first reset signal terminal RESET1 of the pixel circuit 130, and is configured to transmit a first reset signal Reset1. The second reset signal line RL2 is electrically connected to a second reset signal terminal RESET2 of the pixel circuit 130, and is configured to transmit a second reset signal Reset2.

It should be noted that a third scan signal terminal GATE3 of the pixel circuit 130 may be connected to the same signal line as the second reset signal terminal RESET2 of the pixel circuit 130. For example, the second reset signal terminal RESET2 and the third scan signal terminal GATE3 of the pixel circuit 130 are electrically connected to the second reset signal line RL2.

However, in the related art, in a display panel adopting LTPO pixel circuits of 8T1C, in a border region, enable signal lines, scan signal lines and reset signal lines are arranged in two layers, and orthographic projections, on the substrate, of the signal lines arranged in the two layers are staggered, resulting in a large area occupied by the orthographic projections, on the substrate, of the enable signal lines, the scan signal lines and the reset signal lines. That is, a size of the border region is large. In this case, in the display process, a black border displayed at an edge of a mounting hole is large, so that a screen-to-body ratio of the display panel is reduced, and an integrity of an display image is affected.

Figure 6:
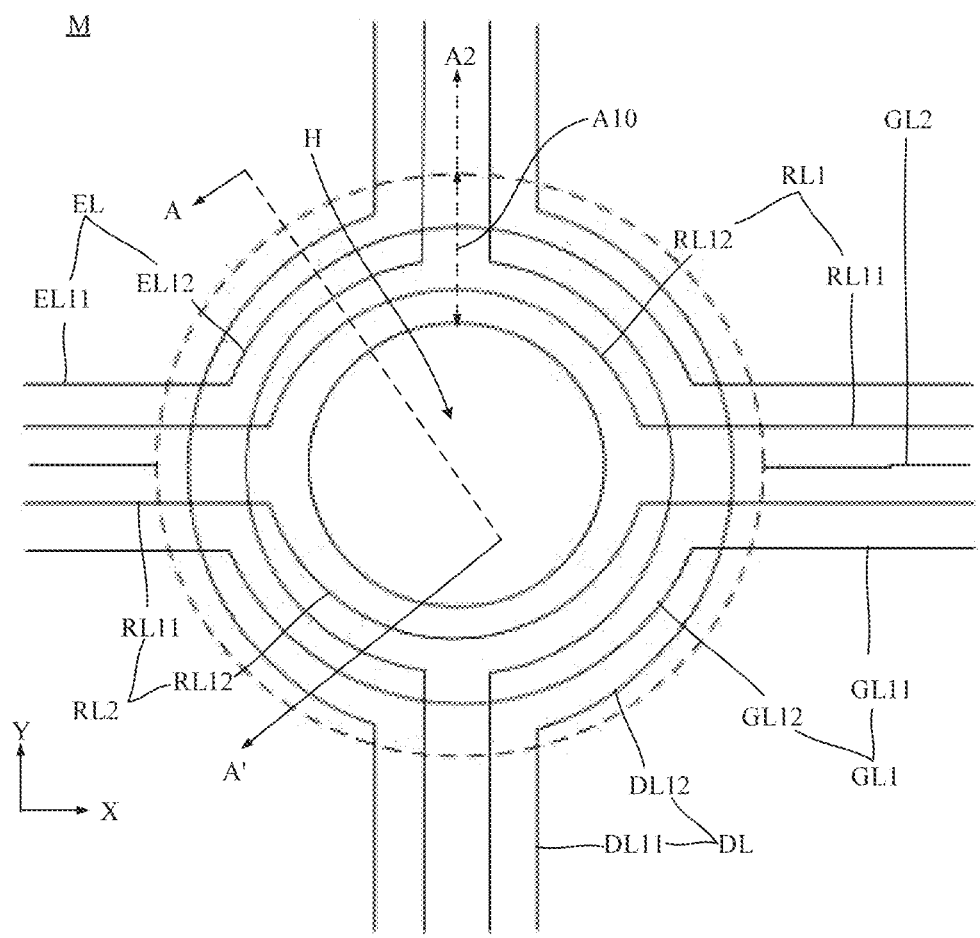
FIG. 6 is a partial enlarged view of the region M in FIG. 5.

Based on this, as shown in FIGS. 2, 3 and 6, some embodiments of the present disclosure provide the display panel 100. Among the plurality of enable signal lines EL, at least one enable signal line EL includes a first enable signal sub-line EL11 located in the primary display region A2 and a second enable signal sub-line EL12 located in the border region A10. Among the plurality of scan signal lines GL, at least one scan signal line GL includes a first scan signal sub-line GL11 located in the primary display region A2 and a second scan signal sub-line GL12 located in the border region A10. Among the plurality of reset signal lines RL, at least one reset signal line RL includes a first reset signal sub-line RL11 located in the primary display region A2 and a second reset signal sub-line RL12 located in the border region A10.

Figure 7:
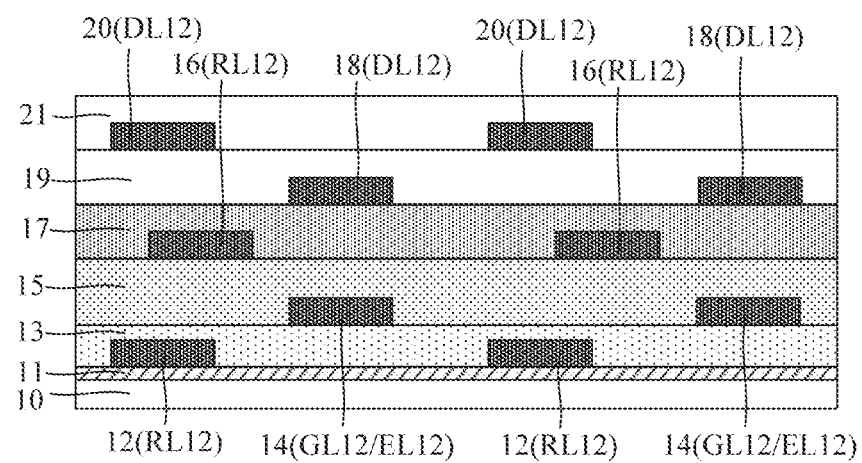
FIG. 7 is a sectional view taken along the line A-A' in FIG. 6.

Referring to FIGS. 6 and 7, among second enable signal sub-lines EL12 of the plurality of enable signal lines EL, second scan signal sub-lines GL12 of the plurality of scan signal lines GL, and second scan signal sub-lines of the plurality of reset signal lines RL, at least three signal lines (at least one of the second enable signal sub-lines EL12, the second scan signal sub-lines GL12 and the second reset signal sub-lines RL12) are located in different three layers.

It can be understood that, in the process of forming signal lines in the same layer, in order to avoid the short circuit between adjacent lines, process gaps are required between the signal lines in the same layer. In the process of forming signal lines in different layers, there is no need to consider the process gap. That is, orthographic projections, on the substrate 10, of signal lines located in different layers may partially or completely coincide, or distances between borders of the orthographic projections, on the substrate 10, of the signal lines located in different layers may be smaller than a size of the process gap, so as to reduce an overall area occupied by the signal lines located in different layers.

Based on this, among the second enable signal sub-lines EL12, the second scan signal sub-lines GL12 and the second reset signal sub-lines RL12, an overall area occupied by signal lines located in different three layers may be reduced, so that an overall area occupied by all the second enable signal sub-lines EL12, the second scan signal sub-lines GL12 and the second reset signal sub-lines RL12 is reduced. That is to say, the area of the border region A10 may be reduced, so as to reduce the black border displayed at the edge of the mounting hole H during the display process and increase the screen-to-body ratio of the display panel 100.

Figure 8:
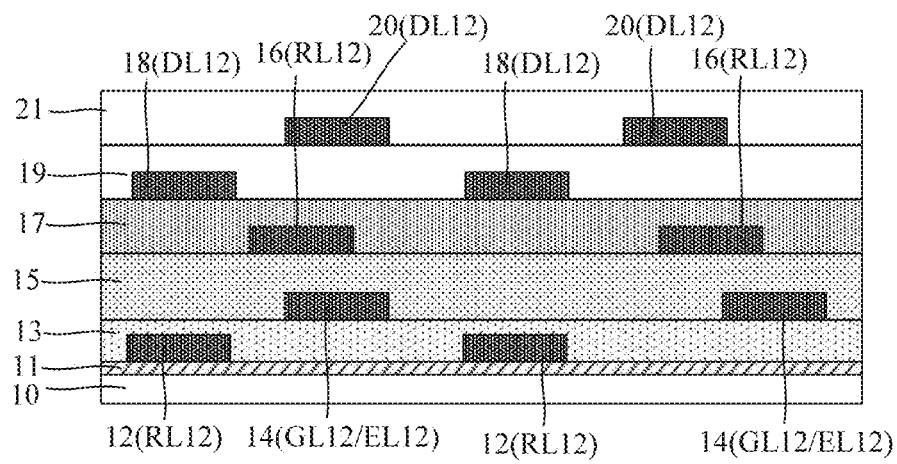
FIG. 8 is another sectional view taken along the line A-A' in FIG. 6.
Figure 9:
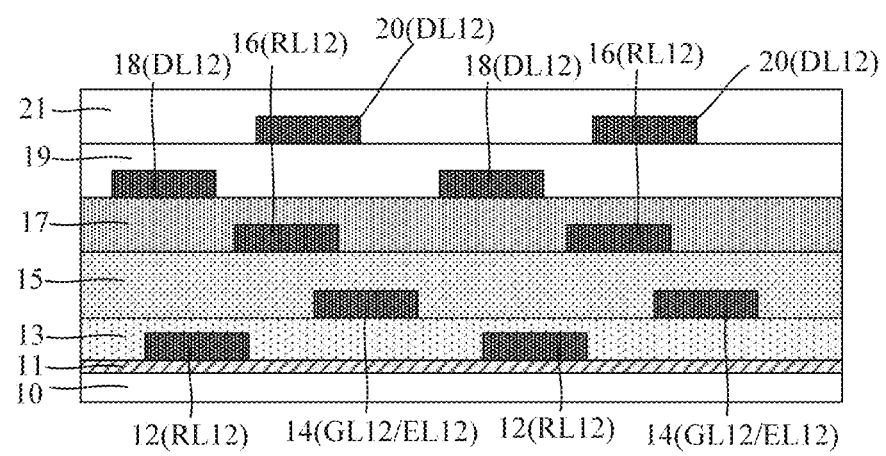
FIG. 9 is yet another sectional view taken along the line A-A' in FIG. 6.

For example, as shown in FIGS. 7, 8 and 9, among the second enable signal sub-lines EL12 of the plurality of enable signal lines EL, the second scan signal sub-lines GL12 of the plurality of scan signal lines GL and the second reset signal sub-lines RL12 of the plurality of reset signal lines RL, orthographic projections, on the substrate 10, of the signal lines located in the different three layers at least partially overlap, so that the overall area occupied by the signal lines located in different layers is reduced, and in turn the area occupied by all the second enable signal sub-lines EL12, the second scan signal sub-lines GL12 and the second reset signal sub-lines RL12 is reduced. Therefore, the area of the border region A10 (see FIG. 6) is reduced, the black border displayed at the edge of the mounting hole H in the display process is reduced, and the screen-to-body ratio of the display panel 100 is increased.

Here, the orthographic projections, on the substrate 10, of the signal lines located in the different three layers at least partially overlap, which will be illustrated below herein in conjunction with the specific signal lines and the specific film layer structure.

In the display panel 100 adopting the LTPO pixel circuits of 8T1C, as shown in FIG. 7, the display panel 100 may include a first gate conductive layer 12, a second gate conductive layer 14 and a third gate conductive layer 16 that are arranged in sequence in a direction perpendicular to the substrate 10 and away from the substrate 10.

It should be noted that, as shown in FIG. 7, the display panel 100 may further include a first gate insulating layer 11, a second gate insulating layer 13 and a third gate insulating layer 15. The first gate insulating layer 11 is disposed between the substrate 10 and the first gate conducting layer 12, the second gate insulating layer 13 is disposed between the first gate conductive layer 12 and the second gate conductive layer 14, and the third gate insulating layer 15 is disposed between the second gate conductive layer 14 and the third gate conductive layer 16.

Here, the enable signal lines EL, the scan signal lines GL, and the reset signal lines RL may be arranged in at least one of the first gate conductive layer 12, the second gate conductive layer 14 and the third gate conductive layer 16.

As mentioned above, signal lines electrically connected to the LTPO pixel circuit of 8T1C may include the enable signal line EL, the first scan signal line GL1, the second scan signal line GL2, the first reset signal line RL1 and the second reset signal line RL2.

In this case, referring to FIG. 6, in the primary display region A2, first enable signal sub-lines EL11 of the enable signal lines EL, first reset signal sub-lines RL11 of the first reset signal lines RL1, and first scan signal sub-lines GL11 of the second scan signal lines GL2 may each be arranged in the first gate conductive layer 12 (see FIG. 7) and/or the second gate conductive layer 14 (see FIG. 7).

Referring to FIG. 6, in the primary display region A2, a part of first scan signal sub-lines GL11 of the first scan signal lines GL1 may be arranged in the second gate conductive layer 14 (see FIG. 7), and another part of the first scan signal sub-lines GL11 of the first scan signal lines GL1 may be arranged in the third gate conductive layer 16 (see FIG. 7). A part of first reset signal sub-lines RL11 of the second reset signal lines RL2 may be arranged in the second gate conductive layer 14 (see FIG. 7), and another part of the first reset signal sub-lines RL11 of the second reset signal lines RL2 may be arranged in the third gate conductive layer 16 (see FIG. 7).

Referring to FIGS. 4 and 6, in the LTPO pixel circuit of 8T1C, a first scan signal sub-line GL11 above a channel region of the second transistor T2 is arranged in the third gate conductive layer 16 (see FIG. 7), and a first reset signal sub-line RL11 above a channel region of the transistor T7 is arranged in the third gate conductive layer 16 (see FIG. 7).

In this case, among the second enable signal sub-lines EL12 of the plurality of enable signal lines EL, the second scan signal sub-lines GL12 of the plurality of scan signal lines GL, and the second reset signal sub-lines RL12 of the plurality of reset signal lines RL, at least three signal lines may be respectively located in the first gate conductive layer 12, the second gate conductive layer 14 and the third gate conductive layer 16.

As mentioned above, signal lines electrically connected to the LTPO pixel circuit of 8T1C may include the enable signal line EL, the first scan signal line GL1, the second scan signal line GL2, the first reset signal line RL1 and the second reset signal line RL2.

It should be understood that, in order to improve accuracy of a signal received by each pixel circuit 130 in the same row of pixel circuits 130 and reduce influence of a voltage drop caused by a length of a signal line, the signal line for transmitting the signal may input the signal by using a double-sided driving manner; in order to save costs, simplify the scan driving circuit 110 in the peripheral region B and reduce the size of the peripheral region B, the signal line for transmitting the signal may input the signal by using a single-sided driving manner.

It will be noted that, as shown in FIG. 2, the single-sided driving manner means that the scan driving circuit 110 may be arranged on a single side, in an extending direction of signal lines, of the peripheral region B of the display panel 100, and the signal lines are driven from the single side line by line in sequence. The double-sided driving manner means that scan driving circuits 110 may be respectively arranged on two sides, in the extending direction of the signal lines, of the peripheral region B of the display panel 100, and the signal lines are driven by the two scan driving circuits 110 simultaneously from the two sides line by line in sequence.

In some embodiments, referring to FIGS. 5 and 6, the second scan signal lines GL2 adopt the double-sided driving manner, and the enable signal lines EL, the first scan signal lines GL1, the first reset signal lines RL1 and the second reset signal lines RL2 adopt the single-sided driving manner, so as to reduce the size of the peripheral region B and reduce the costs in a case where the writing accuracy of the data signal Data is ensured.

In this case, referring to FIGS. 2 and 5, the peripheral region B is located on at least a first side and a second side of the primary display region A2, and portions of the peripheral region B on the first side and the second side of the primary display region A2 are provided with scan driving circuits 110. The first side and the second side are two opposite sides of the primary display region A2 in the extending direction of the signal lines.

For example, as shown in FIGS. 2 and 5, the scan driving circuits 110 includes a first scan driving circuit 111 and a second scan driving circuit 112. The first scan driving circuit 111 is disposed in the peripheral region B and located on the first side of the primary display region A2, and the first scan driving circuit 111 is electrically connected to the first scan signal lines GL1, the second scan signal lines GL2, the enable signal lines EL, and the reset signal lines RL. The second scan driving circuit 112 is disposed in the peripheral region B and located on the second side of the primary display region A2, and the second scan driving circuit 112 is electrically connected to the second scan signal lines GL2.

Some embodiments of the present disclosure will be schematically described below by taking an example in which the second scan signal lines GL2 adopt the double-sided driving manner, and the enable signal lines EL, the first scan signal lines GL1, the first reset signal lines RL1 and the second reset signal lines RL2 adopt the single-sided driving manner.

In this case, referring to FIGS. 5 and 6, among the plurality of enable signal lines EL, an enable signal line EL with an extending direction (the first direction X) passing through the mounting hole H includes a first enable signal sub-line EL11 and a second enable signal sub-line EL12. Among the plurality of first scan signal lines GL1, a first scan signal line GL1 with an extending direction passing through the mounting hole H includes a first scan signal sub-line GL11 and a second scan signal sub-line GL12. A first reset signal line RL1 and a second reset signal line RL2 that have an extending direction passing through the mounting hole H each include a first reset signal sub-line RL11 and a second reset signal sub-line RL12.

Here, since the second scan signal lines GL2 adopt the double-sided driving manner, the second scan signal lines GL2 may be disconnected at the mounting hole H to bypass the mounting hole H. In this way, the second scan signal lines GL2 does not need to pass through the border region A10. That is, there is no need to arrange the second scan signal lines GL2 in the border region A10, so that the area of the border region A10 may be further reduced.

For example, as shown in FIG. 5, the plurality of second scan signal lines GL2 include first-type scan signal lines GL21, second-type scan signal lines GL22, and third-type scan signal lines GL23, and the mounting hole H is located on an extending direction of the second-type scan signal lines GL22 and the third-type scan signal lines GL23.

The first-type scan signal lines GL21 extend from a portion of the peripheral region B located on the first side of the primary display region A2 to another portion of the peripheral region B located on the second side of the primary display region A2 along the first direction X. The second-type scan signal lines GL22 extend from the portion of the peripheral region B located on the first side of the primary display region A2 to the border region A10 along the first direction X. The third-type scan signal lines GL23 extend from the another portion of the peripheral region B located on the second side of the primary display region A2 to the border region A10 along the first direction X.

In this case, the first scan driving circuit 111 is electrically connected to the first scan signal lines GL1, the first-type scan signal lines GL21, the second-type scan signal lines GL22, the enable signal lines EL, and the reset signal lines RL; and the second scan driving circuit 112 is electrically connected to the first-type scan signal lines GL21 and the third-type scan signal lines GL23.

It should be understood that the distribution of the second enable signal sub-lines EL12 of the plurality of enable signal lines EL, the second scan signal sub-lines GL12 of the plurality of scan signal lines GL, and the second reset signal sub-lines RL12 of the plurality of reset signal lines RL in the first gate conductive layer 12, the second gate conductive layer 14 and the third gate conductive layer 16 varies.

For example, referring to FIGS. 6, 7, 8 and 9, the second enable signal sub-lines EL12 of the plurality of enable signal lines EL are located in the second gate conductive layer 14. At least two reset signal lines RL each include a first reset signal sub-line RL11 located in the primary display region A1 and a second reset signal sub-line RL12 located in the border region A10. A part of second reset signal sub-lines RL12 of the at least two reset signal lines RL are located in the first gate conductive layer 12, and another part of second reset signal sub-lines RL12 of the at least two reset signal lines RL are located in the third gate conductive layer 16. The second scan signal sub-lines GL12 of the plurality of scan signal lines GL are located in the second gate conductive layer 14.

For example, as shown in FIGS. 6, 7, 8 and 9, the second enable signal sub-lines EL12 of the plurality of enable signal lines EL are located in the second gate conductive layer 14. The at least two reset signal lines RL include the first reset signal line RL1 and the second reset signal line RL2. At least one first reset signal line RL1 includes a first reset signal sub-line RL11 and a second reset signal sub-line RL12, and the second reset signal sub-line RL12 of the first reset signal line RL1 is located in the first gate conductive layer 12. At least one second reset signal line RL1 includes a first reset signal sub-line RL11 and a second reset signal sub-line RL12, and the second reset signal sub-line RL12 of the second reset signal line RL2 is located in the third gate conductive layer 16. The plurality of scan signal lines GL include the first scan signal lines GL1 and the second scan signal lines GL2, at least one first scan signal line GL1 includes a first scan signal sub-line GL11 and a second scan signal sub-line GL12, and the second scan signal sub-line GL12 of the first scan signal line GL1 is located in the second gate conductive layer 14. It can be known from the above that the second scan signal lines GL2 may not be arranged in the border region A10.

It can be known from the above that, the second reset signal sub-line RL11 of the first reset signal line RL1 is located in the first gate conductive layer 12; the second enable signal sub-lines EL12 of the enable signal lines EL and the second scan signal sub-line GL12 of the first scan signal line GL1 are located in the second gate conductive layer 14; and the second reset signal sub-line RL12 of the second reset signal line RL2 is located in the third gate conductive layer 16.

On this basis, as shown in FIG. 8, an orthographic projection, on the substrate 10, of the second reset signal sub-line RL12 located in the third gate conductive layer 16 may at least partially overlap with orthographic projections, on the substrate 10, of the second enable signal sub-lines EL12 and/or the second scan signal sub-line(s) GL12 located in the second gate conductive layer 14, so as to reduce an entire area occupied by the second reset signal sub-line(s) RL12 located in the third gate conductive layer 16, and the second enable signal sub-lines EL12 and/or the second scan signal sub-line(s) GL12 located in the second gate conductive layer 14. Therefore, the area occupied by all the second enable signal sub-lines EL12, the second scan signal sub-lines GL12 and the second reset signal sub-lines RL12 is reduced, and the area of the border region A10 is reduced.

Alliteratively, as shown in FIG. 7, the orthographic projection, on the substrate 10, of the second reset signal sub-line RL12 located in the third gate conductive layer 16 may at least partially overlap with an orthographic projection, on the substrate 10, of the second reset signal sub-line RL12 located in the first gate conductive layer 12, so as to reduce an entire area occupied by the second reset signal sub-line(s) RL12 located in the third gate conductive layer 16 and the second reset signal sub-line(s) RL12 located in the first gate conductive layer 12. Therefore, the area occupied by all the second enable signal sub-lines EL12, the second scan signal sub-lines GL12 and the second reset signal sub-lines RL12 is reduced, and the area of the border region A10 is reduced.

Alternatively, as shown in FIG. 9, the orthographic projection, on the substrate 10, of the second reset signal sub-line RL12 located in the third gate conductive layer 16 at least partially overlaps with the orthographic projections, on the substrate 10, of the second enable signal sub-lines EL12 and/or the second scan signal sub-line(s) GL12 located in the second gate conductive layer 14, and at least partially overlaps with the orthographic projection, on the substrate 10, of the second reset signal sub-line RL12 located in the first gate conductive layer 12, so as to reduce an entire area occupied by the second reset signal sub-line(s) RL12 located in the third gate conductive layer 16, the second enable signal sub-lines EL12 and/or the second scan signal sub-line(s) GL12 located in the second gate conductive layer 14, and the second reset signal sub-line(s) RL12 located in the first gate conductive layer 12. Therefore, the area occupied by all the second enable signal sub-lines EL12, the second scan signal sub-lines GL12 and the second reset signal sub-lines RL12 is reduced, and the area of the border region A10 is reduced.

Figure 13:
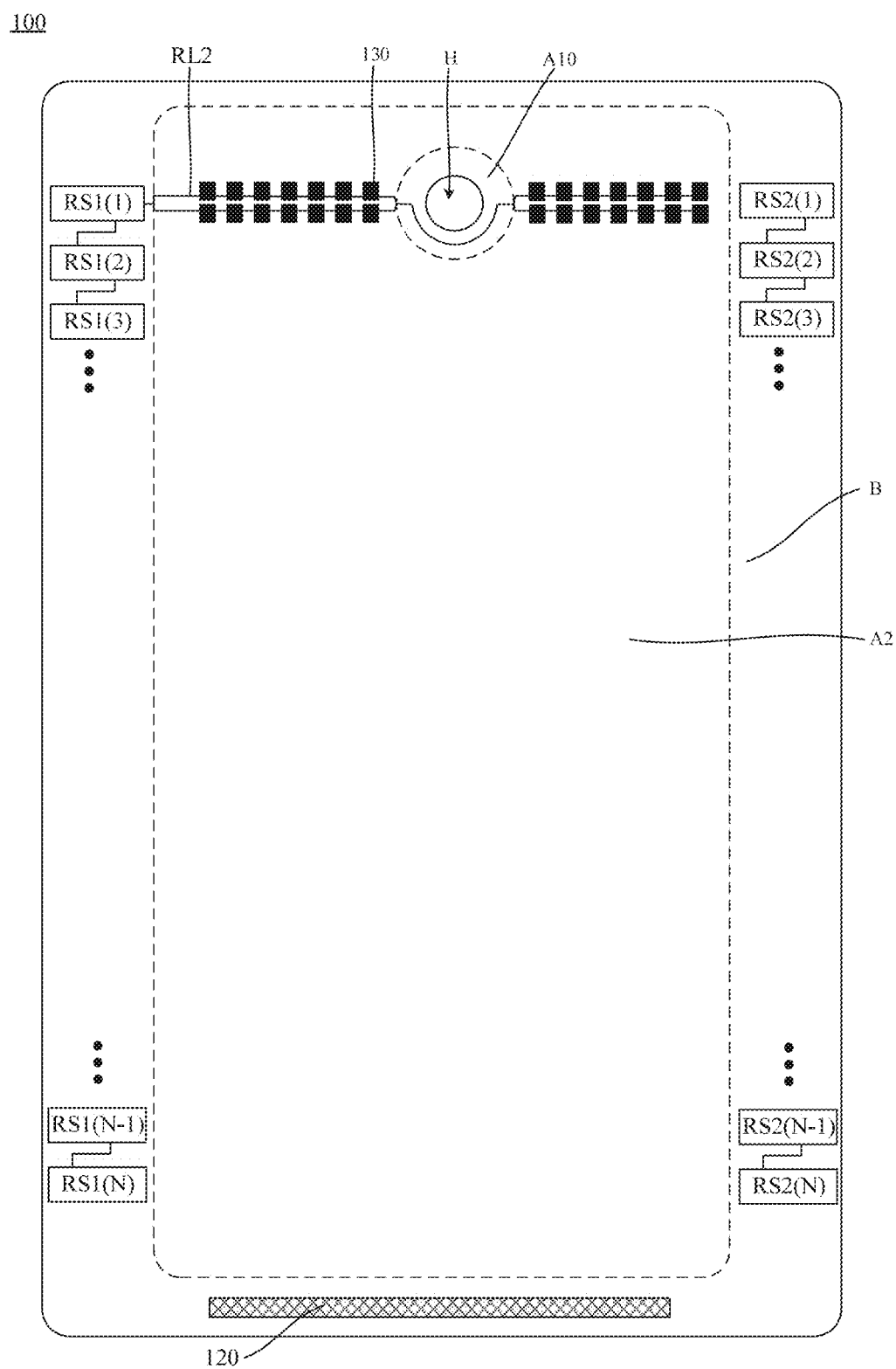
FIG. 13 is a structural diagram of yet another display panel, in accordance with some embodiments.

In some embodiments, referring to FIGS. 2, 5 and 13, the scan driving circuit 110 may include a plurality of shift registers, and a shift register may be electrically connected to pixel circuits 130 in at least one row of sub-pixels P.

For example, as shown in FIGS. 2, 5 and 13, the scan driving circuit 110 includes the first scan driving circuit 111 and the second scan driving circuit 112. The first scan driving circuit 111 includes a plurality of first shift register RS1 that are connected in cascade, each first shift register RS1 is electrically connected to at least two first scan signal lines GL1, at least two enable signal lines EL, at least two first reset signal lines RL1 and at least two second reset signal lines RL2, and each first shift register 111 is further electrically connected to at least two first-type scan signal lines GL21 or at least two second-type scan signal lines GL22. The second scan driving circuit 112 includes a plurality of second shift registers RS2 that are connected in cascade, each second shift register RS2 is electrically connected to at least two first-type scan signal lines GL21 or at least two third-type scan signal lines GL23. In FIG. 13, only the electrical connection between the first shift register and two second reset signal lines is taken as an example for illustration.

On this basis, referring to FIGS. 5 and 13, among at least two first scan signal lines GL1 connected to the same first shift register RS1, one first scan signal line GL1 includes a first scan signal sub-line GL11 and a second scan signal sub-line GL12, each remaining first scan signal line GL1 includes two scan line segments, one scan line segment is connected to the first shift register RS1 and an end of the second scan signal sub-line GL12, and another scan line segment is electrically connected to another end of the second scan signal sub-line GL12 and extends to a border of the second side of the primary display region A2. Therefore, the number of second scan signal sub-lines GL12 arranged in the border region A10 is reduced. As a result, the area occupied by all the second enable signal sub-lines EL12, the second scan signal sub-lines GL12 and the second reset signal sub-lines RL12 is further reduced, and the area of the border region A10 is further reduced. In FIG. 13, only the second reset signal lines are taken as an example for illustration.

Referring to FIGS. 5 and 13, among at least two enable signal lines EL connected to the same first shift register RS1, one enable signal line EL includes a first enable signal sub-line EL11 and a second enable signal sub-line EL12, each remaining enable signal line EL includes two enable line segments, one enable line segment is connected to the first shift register RS1 and an end of the second enable signal sub-line EL12, and another enable line segment is electrically connected to another end of the second enable signal sub-line EL12 and extends to the border of the second side of the primary display region A2. Therefore, the number of second enable signal sub-lines EL12 arranged in the border region A10 is reduced. As a result, the area occupied by all the second enable signal sub-lines EL12, the second scan signal sub-lines GL12 and the second reset signal sub-lines RL12 is further reduced, and the area of the border region A10 is further reduced. In FIG. 13, only the second reset signal lines are taken as an example for illustration.

Referring to FIGS. 5 and 13, among at least two first reset signal lines RL1 connected to the same first shift register RS1, one first reset signal line RL1 includes a first reset signal sub-line RL11 and a second reset signal sub-line RL12, each remaining first reset signal line RL1 includes two first reset line segments, one first reset line segment is connected to the first shift register RS1 and an end of the second reset signal sub-line RL12, and another first reset line segment is electrically connected to another end of the second reset signal sub-line RL12 and extends to the border of the second side of the primary display region A2. Therefore, the number of second reset signal sub-lines RL12 arranged in the border region A10 is reduced. As a result, the area occupied by all the second enable signal sub-lines EL12, the second scan signal sub-lines GL12 and the second reset signal sub-lines RL12 is further reduced, and the area of the border region A10 is further reduced. In FIG. 13, only the second reset signal lines are taken as an example for illustration.

Referring to FIGS. 5 and 13, among at least two second reset signal lines RL2 connected to the same first shift register RS1, one second reset signal line RL2 includes a first reset signal sub-line RL11 and a second reset signal sub-line RL12, each remaining second reset signal line includes two second reset line segments, one second reset line segment is connected to the first shift register RS1 and an end of the second reset signal sub-line RL12, and another second reset line segment is electrically connected to another end of the second reset signal sub-line RL12 and extends to the border of the second side of the primary display region A2. Therefore, the number of second reset signal sub-lines RL12 arranged in the border region A10 is reduced. As a result, the area occupied by all the second enable signal sub-lines EL12, the second scan signal sub-lines GL12 and the second reset signal sub-lines RL12 is further reduced, and the area of the border region A10 is further reduced. In FIG. 13, only the second reset signal lines are taken as an example for illustration.

In some embodiments, as shown in FIGS. 6, 7, 8 and 9, the display panel 100 further includes a first source-drain conductive layer 18 and a second source-drain conductive layer 20, the first source-drain conductive layer 18 is disposed on a side of the third gate conductive layer 16 away from the substrate 10, and the second source-drain conductive layer 20 is disposed on a side of the first source-drain conductive layer 18 away from the substrate 10.

It should be noted that the display panel 100 may further include an interlayer insulating layer 17, a first planarization layer 19 and a second planarization layer 21. The interlayer insulating layer 17 is disposed between the third gate conductive layer 16 and the first source-drain conductive layer 18, the first planarization layer 19 is disposed between the first source-drain conductive layer 18 and the second source-drain conductive layer 20, and the second planarization layer 21 is disposed on a side of the second source-drain conductive layer 20 away from the substrate 10.

On this basis, referring to FIGS. 6, 7, 8 and 9, at least two data lines DL each include a first data sub-line DL11 located in the primary display region A2 and a second data sub-line DL12 located in the border region A10. Among at least two second data sub-lines DL12 located in the border region A10, a part of second data sub-lines DL12 is located in the first source-drain conductive layer 18, and another part of second data sub-lines DL12 is located in the second source-drain conductive layer 20.

In this way, an overall area occupied by data lines DL located in different layers may be reduced, so that an overall area occupied by all the data lines DL may be reduced. That is to say, an area of the border region A10 may be further reduced, so as to reduce the black border displayed at the edge of the mounting hole H during the display process and increase the screen-to-body ratio of the display panel 100.

In some embodiments, referring to FIGS. 7, 8 and 9, a thickness of the third gate insulating layer 15 is greater than a thickness of the interlayer insulating layer 17.

For example, the thickness of the interlayer insulating layer 17 is in a range from 4750 Å to 5250 Å, and the thickness of the third gate insulating layer 15 is in a range from 5225 Å to 5775 Å.

It will be noted that a material of the interlayer insulating layer 17 includes an inorganic material. For example, the material of the interlayer insulating layer 17 includes silicon dioxide and/or silicon nitride. A material of the third gate insulating layer 15 includes an inorganic insulating material. For example, the material of the third gate insulating layer 15 includes silicon nitride and/or silicon oxide.

Figure 11:
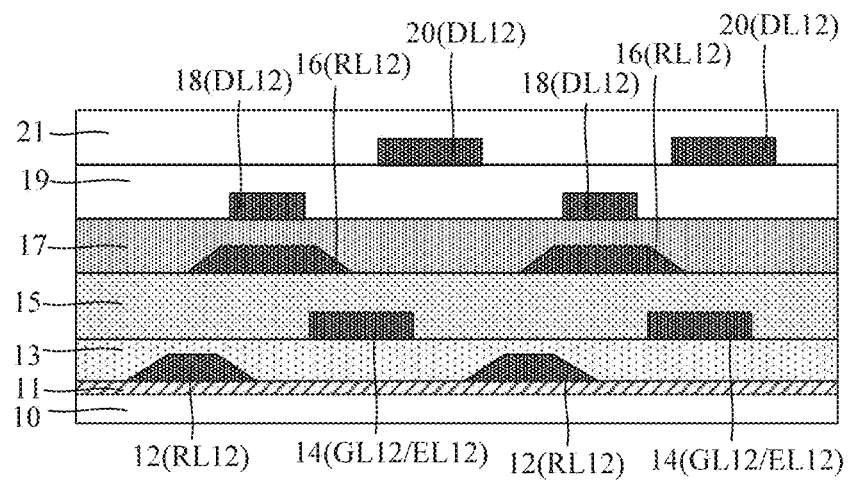
FIG. 11 is yet another sectional view taken along the line A-A' in FIG. 6.

In this case, as shown in FIG. 11, two opposite side faces of the signal line located in the third gate conductive layer 16 are first inclined surfaces; and a distance between borders, away from the substrate 10, of two first inclined surfaces of the same signal line is less than a distance between borders, proximate to the substrate 10, of the two first inclined surfaces. In this way, it may be possible to reduce climbing inclination of the interlayer insulating layer 17 at a boundary of the signal line located in the third gate conductive layer 16, and reduce the risk of breakage of the interlayer insulating layer 17 climbing at the boundary of the signal line located in the third gate conductive layer 16 (at the region C in FIG. 12), and in turn reduce the risk of a short circuit between the signal line located in the third gate conductive layer 16 and the second data sub-line DL12 located in the first source-drain conductive layer 18.

It should be noted that an included angle between a first inclined surface and a plane where a surface of the substrate 10 away from the first gate conductive layer 12 is located is less than or equal to 30°.

Figure 12:
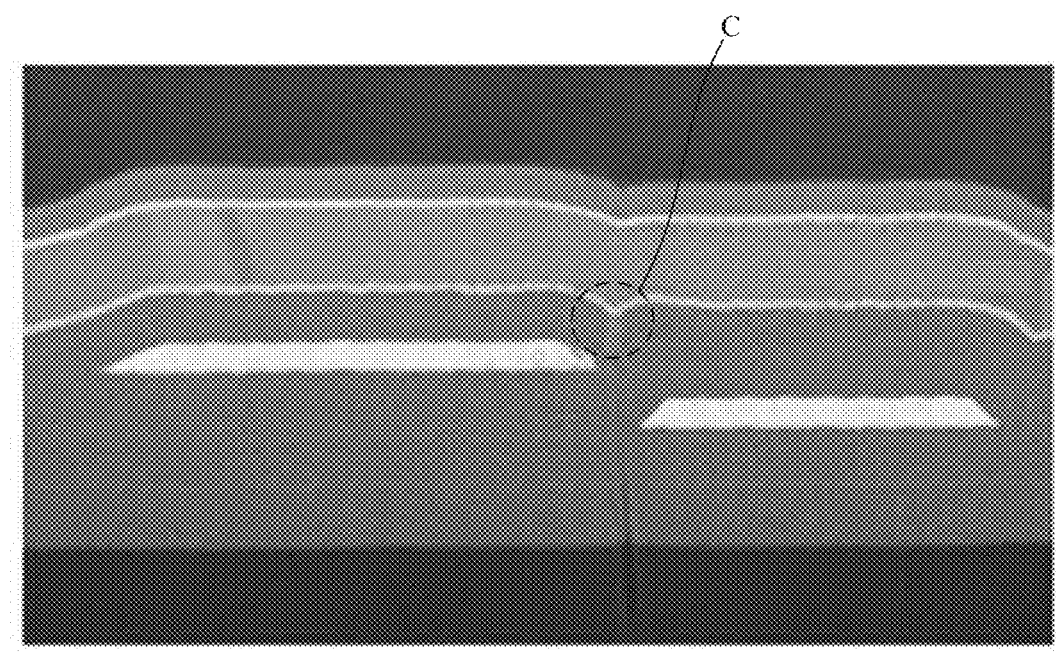
FIG. 12 is an electron microscope diagram taken along the line A-A' in FIG. 6.

In addition, as shown in FIGS. 7, 8 and 9, an orthographic projection, on the substrate 10, of a second data sub-line DL12 located in the first source-drain conductive layer 18 and an orthographic projection, on the substrate 10, of a signal line located in the third gate conductive layer 16 are staggered, so as to avoid a short circuit between the second data sub-line DL12 located in the first source-drain conductive layer 18 and the signal line located in the third gate conductive layer 16 due to the breakage of the interlayer insulating layer 17 (at the region C in FIG. 12).

Figure 10:
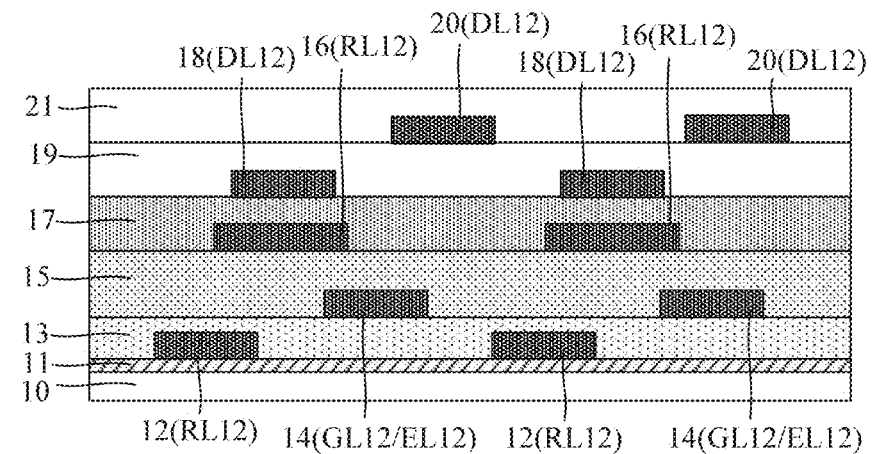
FIG. 10 is yet another sectional view taken along the line A-A' in FIG. 6.

As shown in FIG. 10, a border of the orthographic projection, on the substrate 10, of the second data sub-line DL12 located in the first source-drain conductive layer 18 is located within a border of the orthographic projection, on the substrate 10, of the signal line located in the third gate conductive layer 16, so as to avoid the short circuit between the second data sub-line DL12 located in the first source-drain conductive layer 18 and the signal line located in the third gate conductive layer 16 due to the breakage of the interlayer insulating layer 17 climbing at the border of the signal line located in the third gate conductive layer 16 (at the region C in FIG. 12).

It should be noted that, in a case where the two opposite side faces of the signal line located in the third gate conductive layer 16 are the first inclined surfaces, the border of the orthographic projection, on the substrate 10, of the second data sub-line DL12 located in the first source-drain conductive layer 18 is located within a border of an orthographic projection, on the substrate 10, of a surface of the signal line located in the third gate conductive layer 16 away from the substrate 10.

In some embodiments, as shown in FIGS. 7, 8 and 9, a thickness of the third gate insulating layer 15 is greater than a thickness of the second gate insulating layer 13.

For example, the thickness of the second gate insulating layer 13 is in a range from 1235 Å to 1365 Å; and/or, the thickness of the third gate insulating layer 15 is in a range from 5225 Å to 5775 Å.

In this case, as shown in FIG. 11, two opposite side faces of the signal line located in the first gate conductive layer 12 are second inclined surfaces; and a distance between borders, away from the substrate 10, of two second inclined surfaces of the same signal line is less than a distance between borders, proximate to the substrate 10, of the two second inclined surfaces. In this way, it may be possible to reduce climbing inclination of the second gate insulating layer 13 at a boundary of the signal line located in the first gate conductive layer 12, and reduce the risk of breakage of the second gate insulating layer 13 climbing at the boundary of the signal line located in the first gate conductive layer 12, and in turn reduce the risk of a short circuit between the signal line located in the first gate conductive layer 12 and the signal line located in the second gate conductive layer 14.

It should be noted that an included angle between a second inclined surface and the plane where the surface of the substrate 10 away from the first gate conductive layer 12 is located is less than or equal to 30°.

In addition, as shown in FIGS. 7, 8 and 9, an orthographic projection, on the substrate 10, of the signal line located in the first gate conductive layer 12 and an orthographic projection, on the substrate 10, of the signal line located in the second gate conductive layer 14 are staggered, so as to avoid a short circuit between the signal line located in the first gate conductive layer 12 and the signal line located in the second gate conductive layer 14 due to the breakage of the second gate insulating layer 13.

Referring to FIGS. 7, 8 and 9, a border of the orthographic projection, on the substrate 10, of the signal line located in the second gate conductive layer 14 is located within a border of the orthographic projection, on the substrate 10, of the signal line located in the first gate conductive layer 12, so as to avoid the short circuit between the signal line located in the first gate conductive layer 12 and the signal line located in the second gate conductive layer 14 due to the breakage of the second gate insulating layer 13 climbing at the boundary of the signal line located in the first gate conductive layer 12.

It should be noted that, in a case where the two opposite side faces of the signal line located in the first gate conductive layer 12 are the second inclined surfaces, the border of the orthographic projection, on the substrate 10, of the signal line located in the second gate conductive layer 14 is located within a border of an orthographic projection, on the substrate 10, of a surface of the signal line located in the first gate conductive layer 12 away from the substrate 10.

In order to objectively evaluate technical effects of the embodiments of the present disclosure, the border region of the display panel provided in the above embodiments and the border region of the display panel in the related art are compared below, and the comparison results are shown in Table 1.

TABLE 1

Size comparison table

| Embodiment | Mounting hole diameter/μm | Border region/μm | Encapsulation region/μm | Wiring region/μm |
|---|---|---|---|---|
| Related art 1 | 2740 | 753.8 | 278 | 476.1 |
| Related art 2 | 2740 | 497.6 | 278 | 219.6 |
| Present disclosure | 2740 | 497.6 | 39 | 219.6 |

The related art 1 represents an embodiment of a display panel adopting LTPO pixel circuits of 8T1C, and the related art 2 represents an embodiment of a display panel adopting LTPS pixel circuits of 7T1C.

It can be seen from Table 1 that, in a case where the size of the mounting hole H is 2740 μm, in the embodiments of the present disclosure, when the display panel with the LTPO pixel circuits of 8T1C is adopt, it may be possible to reduce the overall size of the border region by 256.2 μm and realize that the overall size of the border region is approximately equal to the overall size of the border region of the display panel with the LTPS pixel circuits of 7T1C.

The foregoing descriptions are merely specific implementations of the present disclosure, but the protection scope of the present disclosure is not limited thereto. Changes or replacements that any person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display panel, having a functional device setting region and a primary display region at least partially surrounding the functional device setting region, the functional device setting region being provided therein with a mounting hole, the functional device setting region including a border region surrounding the mounting hole;

the display panel comprising:
a substrate;
a plurality of pixel circuits disposed on the substrate and located in the primary display region;
a plurality of enable signal lines electrically connected to the plurality of pixel circuits, wherein at least one enable signal line of the plurality of enable signal lines includes a first enable signal sub-line located in the primary display region and a second enable signal sub-line located in the border region;
a plurality of scan signal lines electrically connected to the plurality of pixel circuits, wherein at least one scan signal line of the plurality of scan signal lines includes a first scan signal sub-line located in the primary display region and a second scan signal sub-line located in the border region;
a plurality of reset signal lines electrically connected to the plurality of pixel circuits, wherein at least one reset signal line of the plurality of reset signal lines includes a first reset signal sub-line located in the primary display region and a second reset signal sub-line located in the border region;
wherein among second enable signal sub-lines of the plurality of enable signal lines, second scan signal sub-lines of the plurality of scan signal lines, and second reset signal sub-lines of the plurality of reset signal lines, at least three signal lines are located in different three layers.

2. The display panel according to claim 1, wherein among the second enable signal sub-lines of the plurality of enable signal lines, the second scan signal sub-lines of the plurality of scan signal lines, and the second reset signal sub-lines of the plurality of reset signal lines, orthographic projections, on the substrate, of the at least three signal lines located in the different three layers at least partially overlap.

3. The display panel according to claim 1, wherein the display panel comprises a first gate conductive layer, a second gate conductive layer and a third gate conductive layer that are arranged in sequence in a direction perpendicular to the substrate and away from the substrate; and among the second enable signal sub-lines of the plurality of enable signal lines, the second scan signal sub-lines of the plurality of scan signal lines, and the second reset signal sub-lines of the plurality of reset signal lines, the at least three signal lines are respectively located in the first gate conductive layer, the second gate conductive layer and the third gate conductive layer.

4. The display panel according to claim 3, wherein the second enable signal sub-lines of the plurality of enable signal lines are located in the second gate conductive layer;
at least two reset signal lines of the plurality of reset signal lines each include a first reset signal sub-line located in the primary display region and a second reset signal sub-line located in the border region; a part of second reset signal sub-lines of the at least two reset signal lines is located in the first gate conductive layer, and another part of second reset signal sub-lines of the at least two reset signal lines is located in the third gate conductive layer; and
the second scan signal sub-lines of the plurality of scan signal lines are located in the second gate conductive layer.

5. The display panel according to claim 4, wherein an orthographic projection, on the substrate, of a second reset signal sub-line located in the third gate conductive layer at least partially overlaps with orthographic projections, on the substrate, of the second enable signal sub-lines and/or the second scan signal sub-lines located in the second gate conductive layer; and/or
the orthographic projection, on the substrate, of the second reset signal sub-line located in the third gate conductive layer at least partially overlaps with an orthographic projection, on the substrate, of a second reset signal sub-line located in the first gate conductive layer.

6. The display panel according to claim 4, wherein the at least two reset signal lines include:
a first reset signal line configured to transmit a first reset signal, wherein a second reset signal sub-line of the first reset signal line is located in the first gate conductive layer; and
a second reset signal line configured to transmit a second reset signal, wherein a second reset signal sub-line of the second reset signal line is located in the third gate conductive layer.

7. The display panel according to claim 4, wherein the plurality of scan signal lines include:
a plurality of first scan signal lines configured to transmit first scan signals, wherein at least one first scan signal line of the plurality of first scan signal lines includes a first scan signal sub-line and a second scan signal sub-line, and the second scan signal sub-line of the at least one first scan signal line is located in the second gate conductive layer.

8. The display panel according to claim 7, wherein the display panel further has a peripheral region located at least on a first side and a second side of the primary display region, and the first side and the second side are two opposite sides of the primary display region;
the plurality of scan signal lines further include:
a plurality of second scan signal lines configured to transmit second scan signals, wherein the plurality of second scan signal lines include first-type scan signal lines, second-type scan signal lines and third-type scan signal lines, and the mounting hole is located on an extending direction of the second-type scan signal lines and the third-type scan signal lines;
wherein the first-type scan signal lines extend from a portion of the peripheral region located on the first side of the primary display region to another portion of the peripheral region located on the second side of the primary display region along a first direction; the second-type scan signal lines extend from the portion of the peripheral region located on the first side of the primary display region to the border region along the first direction; the third-type scan signal lines extend from the another portion of the peripheral region located on the second side of the primary display region to the border region along the first direction.

9. The display panel according to claim 8, further comprising: a first scan driving circuit disposed in the peripheral region and located on the first side of the primary display region, wherein the first scan driving circuit is electrically connected to the plurality of first scan signal lines, the first-type scan signal lines, the second-type scan signal lines, the plurality of enable signal lines, and the plurality of reset signal lines; and
a second scan driving circuit disposed in the peripheral region and located on the second side of the primary display region, wherein the second scan driving circuit is electrically connected to the first-type scan signal lines and the third-type scan signal lines.

10. The display panel according to claim 9, wherein the at least two reset signal lines include a first reset signal line and a second reset signal line: the first scan driving circuit includes a plurality of first shift registers that are connected in cascade, each first shift register is electrically connected to at least two of the plurality of first scan signal lines, at least two of the plurality of enable signal lines, at least two first reset signal lines and at least two second reset signal lines, and each first shift register is further electrically connected to at least two of the first-type scan signal lines or at least two of the second-type scan signal lines;
the second scan driving circuit includes a plurality of second shift registers that are connected in cascade, and each second shift register is electrically connected to at least two of the first-type scan signal lines or at least two of the third-type scan signal lines.

11. The display panel according to claim 10, wherein among at least two first scan signal lines connected to a same first shift register, one first scan signal line includes a first scan signal sub-line and a second scan signal sub-line, each remaining first scan signal line includes two scan line segments, one scan line segment is connected to the same first shift register and an end of the second scan signal sub-line of the one first scan signal line, and another scan line segment is electrically connected to another end of the second scan signal sub-line of the one first scan signal line and extends to a border of the second side of the primary display region;
and/or among at least two enable signal lines connected to the same first shift register, one enable signal line includes a first enable signal sub-line and a second enable signal sub-line, each remaining enable signal line includes two enable line segments, one enable line segment is connected to the same first shift register and an end of the second enable signal sub-line of the one enable signal line, and another enable line segment is electrically connected to another end of the second enable signal sub-line of the one enable signal line and extends to the border of the second side of the primary display region;
and/or among at least two first reset signal lines connected to the same first shift register, one first reset signal line includes a first reset signal sub-line and a second reset signal sub-line, each remaining first reset signal line includes two first reset line segments, one first reset line segment is connected to the same first shift register and an end of the second reset signal sub-line of the one first reset signal line, and another first reset line segment is electrically connected to another end of the second reset signal sub-line of the one first reset signal line and extends to the border of the second side of the primary display region;
and/or among at least two second reset signal lines connected to the same first shift register, one second reset signal line includes a first enable signal sub-line and a second enable signal sub-line, each remaining second reset signal line includes two second reset line segments, one second reset line segment is connected to the same first shift register and an end of the second reset signal sub-line of the one second reset signal line, and another second reset line segment is electrically connected to another end of the second reset signal sub-line of the one second reset signal line and extends to the border of the second side of the primary display region.

12. The display panel according to claim 3, further comprising:
a first source-drain conductive layer and a second source-drain conductive layer, wherein the first source-drain conductive layer is disposed on a side of the third gate conductive layer away from the substrate, and the second source-drain conductive layer is disposed on a side of the first source-drain conductive layer away from the substrate; and
a plurality of data lines electrically connected to the plurality of pixel circuits, wherein at least two data lines include a first data sub-line located in the primary display region and a second data sub-line located in the border region; among at least two second data sub-lines located in the border region, a part of second data sub-lines is located in the first source-drain conductive layer, and another part of second data sub-lines is located in the second source-drain conductive layer.

13. The display panel according to claim 12, wherein an orthographic projection, on the substrate, of a second data sub-line located in the first source-drain conductive layer and an orthographic projection, on the substrate, of a signal line located in the third gate conductive layer are staggered; and/or
a border of the orthographic projection, on the substrate, of the second data sub-line located in the first source-drain conductive layer is located within a border of the orthographic projection, on the substrate, of the signal line located in the third gate conductive layer.

14. The display panel according to claim 12, wherein two opposite side faces of a signal line located in the third gate conductive layer are first inclined surfaces; and a distance between borders, away from the substrate, of two first inclined surfaces of a same signal line is less than a distance between borders, proximate to the substrate, of the two first inclined surfaces.

15. The display panel according to claim 14, wherein an included angle between a first inclined surface and a plane where a surface of the substrate away from the first gate conductive layer is located is less than or equal to 30°.

16. The display panel according to claim 3, wherein an orthogonal projection, on the substrate, of a signal line located in the first gate conductive layer and an orthogonal projection, on the substrate, of a signal line located in the second gate conductive layer are staggered; and/or a border of the orthographic projection, on the substrate, of the signal line located in the second gate conductive layer is located within a border of the orthographic projection, on the substrate, of the signal line located in the first gate conductive layer.

17. The display panel according to claim 3, wherein two opposite side faces of a signal line located in the first gate conductive layer are second inclined surfaces; and a distance between borders, away from the substrate, of two second inclined surfaces of a same signal line is less than a distance between borders, proximate to the substrate, of the two second inclined surfaces.

18. The display panel according to claim 17, wherein an included angle between a second inclined surface and a plane where a surface of the substrate away from the first gate conductive layer is located is less than or equal to 30°.

19. The display panel according to claim 3, further comprising:

an interlayer insulating layer disposed between the first source-drain conductive layer and the third gate conductive layer;

a second gate insulating layer disposed between the first gate conductive layer and the second gate conductive layer; and a third gate insulating layer disposed between the second gate conductive layer and the third gate conductive layer, wherein a thickness of the third gate insulating layer is greater than a thickness of the interlayer insulating layer, and is greater than a thickness of the second gate insulating layer.

20. A display device, comprising the display panel according to claim 1.

* * * * *